(12) United States Patent
Bocharov et al.

(10) Patent No.: US 10,366,339 B2
(45) Date of Patent: Jul. 30, 2019

(54) METHOD FOR EFFICIENT IMPLEMENTATION OF DIAGONAL OPERATORS OVER CLIFFORD+T BASIS

(71) Applicant: Microsoft Technology Licensing, LLC, Redmond, WA (US)

(72) Inventors: Alexei Bocharov, Redmond, WA (US); Krysta Svore, Seattle, WA (US); Jonathan Welch, Pensacola, FL (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 12 days.

(21) Appl. No.: 15/528,086

(22) PCT Filed: Nov. 20, 2015

(86) PCT No.: PCT/US2015/061711
§ 371 (c)(1),
(2) Date: May 18, 2017

(87) PCT Pub. No.: WO2016/081788
PCT Pub. Date: May 26, 2016

(65) Prior Publication Data
US 2017/0316336 A1 Nov. 2, 2017

Related U.S. Application Data

(60) Provisional application No. 62/083,102, filed on Nov. 21, 2014.

(51) Int. Cl.
*G06F 17/50* (2006.01)
*G06N 10/00* (2019.01)

(52) U.S. Cl.
CPC ........... *G06N 10/00* (2019.01); *G06F 17/505* (2013.01)

(58) Field of Classification Search
CPC ..... G06N 99/002; G06N 10/00; G06F 17/505
USPC ......................................................... 716/104
See application file for complete search history.

(56) References Cited

U.S. PATENT DOCUMENTS

| | | | |
|---|---|---|---|
| 6,456,994 B1 | 9/2002 | Tucci | |
| 7,184,555 B2 | 2/2007 | Whaley et al. | |
| 7,590,607 B2 * | 9/2009 | Williams | B82Y 10/00 706/45 |
| 7,875,876 B1 | 1/2011 | Wandzura et al. | |
| 8,190,553 B2 | 5/2012 | Routt | |
| 8,209,279 B2 | 6/2012 | Freedman et al. | |
| 8,671,369 B2 | 3/2014 | Ahn | |

(Continued)

FOREIGN PATENT DOCUMENTS

EP     1525555     4/2005

OTHER PUBLICATIONS

Vadym Kliuchnikov et al., "Practical approximation of single-qubit unitaries by single-qubit quantum Clifford and T circuits". Mar. 13, 2014. Obtained at https://arxiv.org/pdf/1212.6964.pdf pp. 1-11.*

(Continued)

*Primary Examiner* — Stacy Whitmore
(74) *Attorney, Agent, or Firm* — Klarquist Sparkman, LLP

(57) ABSTRACT

Quantum circuits and circuit designs are based on factorizations of diagonal unitaries using a phase context. The cost/complexity of phase sparse/phase dense approximations is compared, and a suitable implementation is selected. For phase sparse implementations in the Clifford+T basis, required entangling circuits are defined based on a number of occurrences of a phase in the phase context in a factor of the diagonal unitary.

21 Claims, 8 Drawing Sheets

(56) References Cited

U.S. PATENT DOCUMENTS

| | | | |
|---|---|---|---|
| 2004/0119061 A1* | 6/2004 | Wu | B82Y 10/00 257/9 |
| 2005/0273306 A1 | 12/2005 | Hilton et al. | |
| 2006/0123363 A1 | 6/2006 | Williams et al. | |
| 2008/0140749 A1 | 6/2008 | Amato et al. | |
| 2013/0246495 A1 | 9/2013 | Svore et al. | |
| 2013/0325148 A1* | 12/2013 | Mustafa | G05B 13/048 700/31 |
| 2014/0026108 A1 | 1/2014 | Bocharov et al. | |
| 2014/0264288 A1 | 9/2014 | Svore et al. | |
| 2014/0280427 A1 | 9/2014 | Bocharov et al. | |

OTHER PUBLICATIONS

Barenco et al., "Elementary Gates for Quantum Computation," available at: http://arxiv.org/abs/quant-ph/9503016v1, pp. 1-31 (Mar. 23, 1995).

Hogg et al., "Tools for Quantum Algorithms," available at: http://arxiv.org/abs/quant-ph/9811073v2, pp. 1-15 (Dec. 30, 1998).

International Preliminary Report on Patentability from International Application No. PCT/US2015/061711, dated Mar. 8, 2017, 18 pages.

International Search Report and Written Opinion from International Application No. PCT/US2015/061711, dated Feb. 25, 2016, 12 pages.

Kliuchnikov, "New methods for Quantum Compiling," Doctoral dissertation, The University of Waterloo, available at: http://hdl.handle.net/10012/8394, 72 pages (Apr. 30, 2014).

Welch, "On the Synthesis of Quantum Circuits for Diagonal Operators in Quantum Computation," Doctoral dissertation, Harvard University, available at: http://nrs.harvard.edu/urn-3:HuL.InstRepos:23845468, 63 pages (Sep. 29, 2015).

Written Opinion of the International Preliminary Examining Authority from International Application No. PCT/US2015/061771, dated Oct. 20, 2016, 7 pages.

* cited by examiner

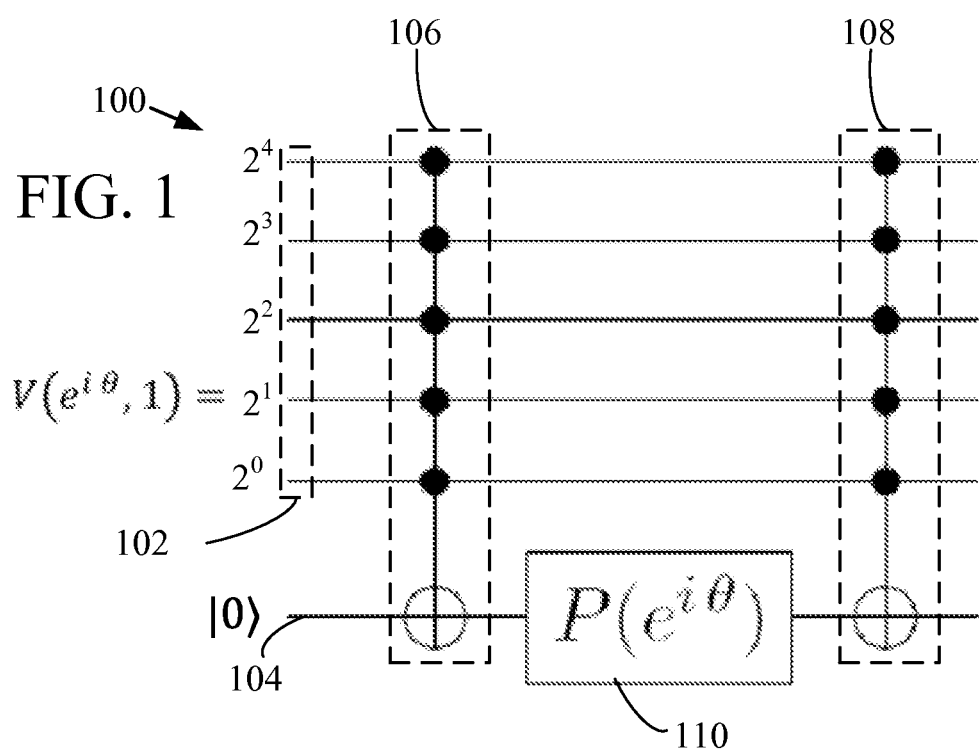

METHOD FOR EFFICIENT IMPLEMENTATION OF DIAGONAL OPERATORS OVER CLIFFORD+T BASIS

CROSS REFERENCE TO RELATED APPLICATIONS

This is the U.S. National Stage of International Application No. PCT/US2015/061711, filed Nov. 20, 2015, which was published in English under PCT Article 21(2), which in turn claims the benefit of U.S. Provisional Application No. 62/083,102, filed Nov. 21, 2014. The provisional application is incorporated herein by reference in its entirety.

FIELD

The disclosure pertains to quantum computing.

BACKGROUND

Diagonal Operators appear in a wide variety of different quantum computational algorithms, and their efficient implementation is essential for creating practical implementations on proposed quantum computational architectures. In the case of exact diagonal operator decompositions, where the precision of approximation is exact, the exact decompositions exhibit the property that all entanglement occurs through the use of elementary CNOT gates which have relatively small fault-tolerant cost. This results in the entirety of the quantum resource complexity being placed in the number of single-qubit rotations, which, in these methods, has in general an exponential scaling. In some cases, exact decompositions of diagonal operators produce single qubit rotations that are difficult or impossible to implement exactly using the Clifford+T universal gate set. Hence single-qubit approximation methods are required in general.

Since exact decomposition methods are based around the construct of performing a tensor product type decomposition using a complete functional basis representation of the operator space, there is little to no freedom in how phase angles are distributed in the corresponding circuit. This is largely a consequence of the decompositions being exact, but it has the undesirable side effect of having only a single way of implementing the associated quantum circuit under the exact decomposition.

If the phases appearing in the diagonal unitary are chosen from a finite collection of phases, the exact methods in general produce an overly pessimistic (large) number of single-qubit rotations in an attempt to delocalize the rotations required over the entire n-qubit operational space. In some cases, highly non-local correlations in phase values can lead to small numbers of single-qubit rotations. Since these methods use only elementary CNOT entanglement operators, there is essentially zero fault-tolerant implementation cost associated with the entanglement properties of the resulting circuit due to the low cost of implementing Clifford gates in, for example, typical quantum error correction codes. However, if the number of distinct phases is small and/or the distribution of phases along the diagonal is highly localized to a particular region of the operator space, such non-local decompositions lead to exponential scaling in the number of single qubit rotations. Since in general the rotation angles produced by these methods are not exactly implementable over the HT basis, approximation methods are required for their decomposition into this basis. However, since these methods result in zero fault-tolerant implementation cost in the entangling operations, the fault-tolerant cost of the circuit can rapidly grow to the point of being infeasible on practical implementations of quantum computing architectures. Accordingly, approximate methods are needed.

SUMMARY

Disclosed herein are methods and apparatus that define quantum circuits for implementing n-qubit diagonal unitaries. The disclosed approaches provide more efficient approximations of the target diagonal unitaries than conventional designs in practically important ranges of parameters. The circuits produced using the disclosed approaches are called circuits with cascaded entanglers. Based on a phase context, a plurality of rotation operators having rotation angles in the phase context is selected and the quantum circuit is defined based on the plurality of rotation operators applied to an ancillary qubit. The design of circuits with cascaded entanglers exploits the sparseness of the phase context, as a part of the circuit synthesis process this design is compared with other designs such as exact designs, so that an optimal circuit can be selected. Typically, the diagonal unitary is factored as a product of diagonal operators, and each of the factors is represented as a single rotation and one or more entanglement circuits. The entanglement circuits can be represented in the Clifford+T basis based on a number of occurrences of a respective phase in the associated factor.

BRIEF DESCRIPTION OF THE DRAWINGS

FIG. 1 illustrates a quantum circuit implementing $V(\phi,l)$ for $l=1$.

DETAILED DESCRIPTION

Figure 2A:
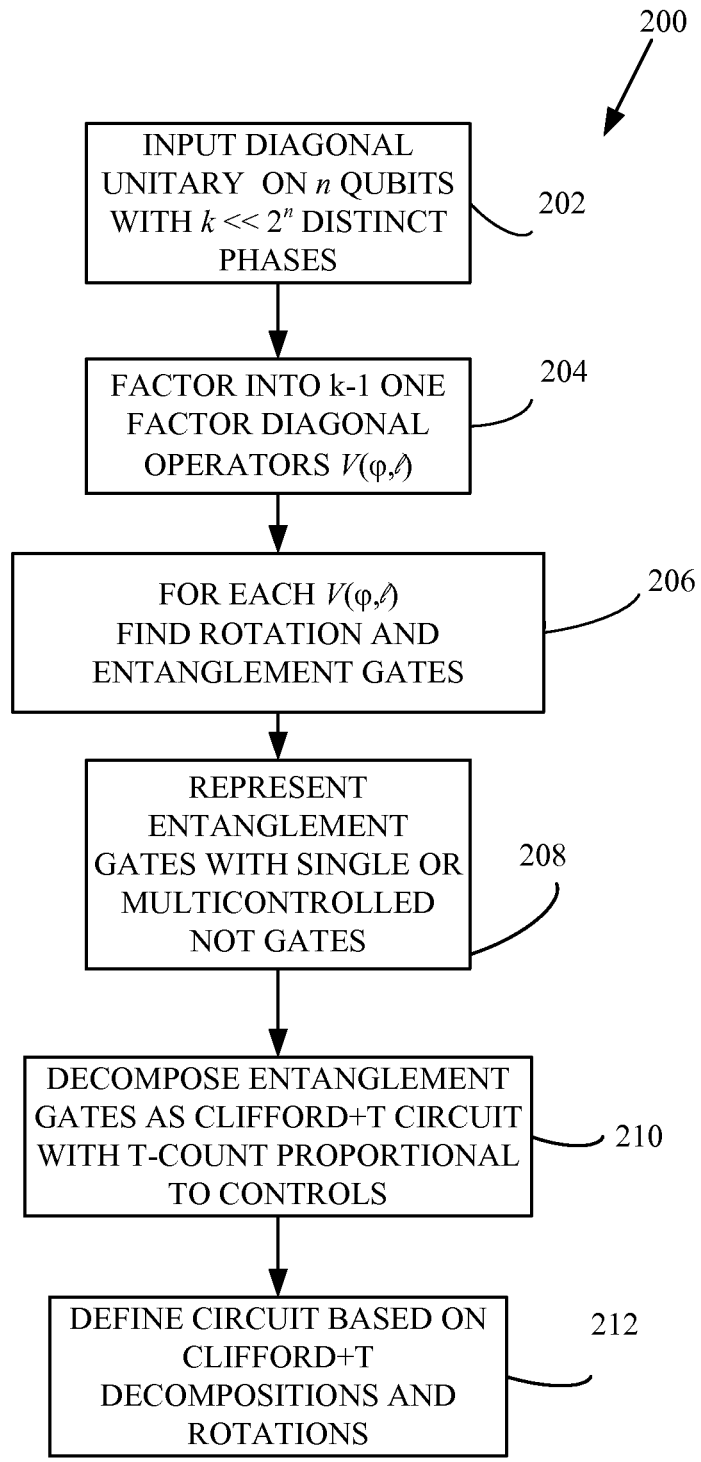
FIG. 2A illustrates a representative method of defining a quantum circuit for a diagonal unitary using a phase context.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

In some examples, the terms "unitary" or "unitary matrix" are used to refer to functions performed by quantum circuits that can be implemented in a variety of ways. In the following description, such matrices are also referred to as circuits for convenient description. Some commonly used quantum gates corresponding to single-qubit operators X, Y, and Z (referred as the Pauli gates) can be represented as:

$$X = \begin{bmatrix} 0 & 1 \\ 1 & 0 \end{bmatrix},$$

$$Y = \begin{bmatrix} 0 & -i \\ i & 0 \end{bmatrix},$$

$$Z = \begin{bmatrix} 1 & 0 \\ 0 & -1 \end{bmatrix}$$

$$Multi-ControlledNot = \begin{bmatrix} 1 & 0 & & & & \\ 0 & 1 & & & & \\ & & \ddots & & & \\ & & & \ddots & & \\ & & & & 0 & 1 \\ & & & & 1 & 0 \end{bmatrix}.$$

This multi-controlled CNOT is controlled on the 1 string (all controls set to 1), but alternatively control can be provided with any bit string.

The Clifford+T basis can be used to define an arbitrary quantum circuit and includes the Hadamard gate H, the phase gate S, the controlled-not gate (CNOT) and the T-gate, defined as follows:

$$H = \frac{1}{\sqrt{2}} \begin{pmatrix} 1 & 1 \\ 1 & -1 \end{pmatrix}$$

-continued $$S = \begin{pmatrix} 1 & 0 \\ 0 & i \end{pmatrix}$$

$$CNOT = \begin{pmatrix} 1 & 0 & 0 & 0 \\ 0 & 1 & 0 & 0 \\ 0 & 0 & 0 & 1 \\ 0 & 0 & 1 & 0 \end{pmatrix}$$

$$T = \begin{pmatrix} 1 & 0 \\ 0 & e^{i\pi/4} \end{pmatrix}$$

An arbitrary quantum computation can be performed using combinations of these gates and the scalar $\omega=e^{i\pi/4}$. The examples disclosed herein are described with reference to this gate set. In addition, in the following description, unitaries are illustrated as dependent on phases $\varphi_i$ that depend on corresponding rotation angles $\theta_i$ such that $\varphi_i=\exp(i\theta_i)$. In some cases, $\varphi_i$ is used to refer to a complex term $\exp(i\varphi_i)$, and the meaning of $\varphi_i$ will be apparent based on the context. The term "cost" is used herein to provide a measure of circuit complexity, a lower cost circuit design requiring fewer or less complex gates for its implementation. In some cases, cost is evaluated based on a number of T gates in a final circuit. However, cost can also be based on a number of single-qubit rotations required in the final circuit.

Introduction

Some disclosed examples pertain to methods and apparatus that address the deficiencies of exact methods and permit realization of diagonal unitaries using a small number of phases to produce phase-sparse representations. Sparseness can be measured based on a ratio of a number of distinct phases to the total number of phases associated with a diagonal unitary. For example, for a unitary that is represented as an n by n diagonal matrix with k distinct phases, a sparseness coefficient can be defined as $s=k/2^n$. In some examples, a diagonal matrix for which s is less than ½, ¼, ⅛, 1/16, ... $2^{1-n}$ can be referred to as sparse. Typically, values assorted with s=½ or ¼ are considered sparse. In some examples, phase sparse decompositions and exact or other implementations of a unitary are compared, and a representation associated with a lower cost is selected.

As used herein, a phase context is a set of k distinct phases between $\phi_i$ and $2\pi$. A phase context can include phases that are randomly or otherwise selected. By performing a decomposition of a unitary over a phase context associated with an operator rather than directly decomposing the operator, flexibility in how rotation angles are distributed is provided, since the rotation angles to be approximated can always be given as the ratio of two distinct phases from the phase context. This provides the ability to choose one of several possible phase context decompositions so that the resulting single-qubit rotations can be adjusted to have angles which have minimal complexity under a given single qubit phase rotation approximation and required accuracy. Additionally, since the decomposition is over the phase context rather than the operator itself, there will never be more than k single-qubit rotations required to implement the operator, where k is the number of phases in the underlying phase context.

The trade-off associated with this benefit is that unlike exact methods, the phase context decomposition has a potentially significant fault-tolerant cost associated with the entangling operations which are in general are multi-controlled NOT gates, where the controls can be controlled on either 0 or 1 based on a series of bit values in a bit string.

However these entangling operators have an exact fault-tolerant cost, and this cost does not depend on the target accuracy of the single qubit phase approximations. Therefore the asymptotic implementation will generally be dominated by the number of single qubit phase rotations that need to be approximated. In the case of a phase-sparse matrix, the number of such rotations will in general be fewer in a cascaded entangler framework compared to an exact decomposition.

Phase Contexts and Cascaded Entanglers

Consider a diagonal unitary operator on n qubits with $k \ll 2^n$ distinct phases $\phi_i$, i.e., a unitary U of the form $U = \mathrm{diag}(\phi_1, \ldots, \phi_1, \phi_2, \ldots, \phi_2, \phi_k, \ldots, \phi_k)$ A phase context decomposition can be performed by recursively factoring U into a product of k−1 phase rotations. To this end, U is represented as a product of a global phase (e.g., $\phi_1$) and k−1 one-parameter diagonal operators of the form:

$$V(\phi, \ell) = diag\left(\underbrace{1, \ldots, 1}_{2^n - \ell}, \underbrace{\phi, \ldots, \phi}_{\ell}\right).$$

An example decomposition of $$V(\phi, \ell) = diag\left(\underbrace{1, \ldots, 1}_{2^n - \ell}, \underbrace{\phi, \ldots, \phi}_{\ell}\right).$$

is illustrated below. An input diagonal unitary $\hat{U}$ is of the form:

$$\hat{U} = \begin{pmatrix} \phi_0 & 0 & 0 & 0 & 0 & 0 & 0 & 0 \\ 0 & \phi_0 & 0 & 0 & 0 & 0 & 0 & 0 \\ 0 & 0 & \phi_1 & 0 & 0 & 0 & 0 & 0 \\ 0 & 0 & 0 & \phi_1 & 0 & 0 & 0 & 0 \\ 0 & 0 & 0 & 0 & \phi_1 & 0 & 0 & 0 \\ 0 & 0 & 0 & 0 & 0 & \phi_2 & 0 & 0 \\ 0 & 0 & 0 & 0 & 0 & 0 & \phi_2 & 0 \\ 0 & 0 & 0 & 0 & 0 & 0 & 0 & \phi_3 \end{pmatrix},$$

wherein $\phi_0, \phi_1, \phi_2, \phi_3$ are complex numbers of unit modulus representing four distinct phases. The diagonal entries can be scaled by the phase $\phi_0$ so that $\phi_i' = \phi_i / \phi_0$ for i=1, 2, 3 to produce a scaled unitary U:

$$U = \exp(i\phi_0) \begin{pmatrix} 1 & 0 & 0 & 0 & 0 & 0 & 0 & 0 \\ 0 & 1 & 0 & 0 & 0 & 0 & 0 & 0 \\ 0 & 0 & \phi_1' & 0 & 0 & 0 & 0 & 0 \\ 0 & 0 & 0 & \phi_1' & 0 & 0 & 0 & 0 \\ 0 & 0 & 0 & 0 & \phi_1' & 0 & 0 & 0 \\ 0 & 0 & 0 & 0 & 0 & \phi_2' & 0 & 0 \\ 0 & 0 & 0 & 0 & 0 & 0 & \phi_2' & 0 \\ 0 & 0 & 0 & 0 & 0 & 0 & 0 & \phi_3' \end{pmatrix}.$$

The scaled unitary U can then be represented as a product of diagonal matrices $M_i$. In this example, a matrix associated with $\phi_0$ is just the identity, i.e., $$M_0 = \begin{pmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{pmatrix}$$

Because any phase other than 1 occurs six times in $\hat{U}$, a first component matrix $M_1$ in a decomposition can be written as:

$$M_1 = \begin{pmatrix} 1 & 0 & 0 & 0 & 0 & 0 & 0 & 0 \\ 0 & 1 & 0 & 0 & 0 & 0 & 0 & 0 \\ 0 & 0 & \phi_1' & 0 & 0 & 0 & 0 & 0 \\ 0 & 0 & 0 & \phi_1' & 0 & 0 & 0 & 0 \\ 0 & 0 & 0 & 0 & \phi_1' & 0 & 0 & 0 \\ 0 & 0 & 0 & 0 & 0 & \phi_1' & 0 & 0 \\ 0 & 0 & 0 & 0 & 0 & 0 & \phi_1' & 0 \\ 0 & 0 & 0 & 0 & 0 & 0 & 0 & \phi_1' \end{pmatrix}$$

As shown above, diagonal elements of the last six rows are $\phi_i'$. Similarly, a second component matrix $M_2$ in a decomposition can be written as:

$$M_2 = \begin{pmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & \frac{\phi_2'}{\phi_1'} & 0 & 0 \\ 0 & 0 & 0 & 0 & 0 & 0 & \frac{\phi_2'}{\phi_1'} & 0 \\ 0 & 0 & 0 & 0 & 0 & 0 & 0 & \frac{\phi_2'}{\phi_1'} \end{pmatrix}$$

In this case, any phase other than 1 or $\phi_i'$ occurs three times, so that diagonal elements of the last three rows are set to $\phi_2'/\phi_1'$. Finally, a third component matrix $M_3$ in a decomposition can be written as:

$$M_3 = \begin{pmatrix} 1 & 0 & 0 & 0 & 0 & 0 & 0 \\ 0 & 1 & 0 & 0 & 0 & 0 & 0 \\ 0 & 0 & 1 & 0 & 0 & 0 & 0 \\ 0 & 0 & 0 & 1 & 0 & 0 & 0 \\ 0 & 0 & 0 & 0 & 1 & 0 & 0 \\ 0 & 0 & 0 & 0 & 0 & 1 & 0 \\ 0 & 0 & 0 & 0 & 0 & 0 & 1 \\ 0 & 0 & 0 & 0 & 0 & 0 & \frac{\phi_3'}{\phi_2'} \end{pmatrix},$$

as any phase other than 1, $\phi_1, \phi_2$ (i.e., $\phi_3$) occurs once, so a diagonal element in the eighth row is set to $\phi_3'/\phi_2'$. The final decomposition is $U_D = \exp(i\phi_0) M_0 M_1 M_2 M_3$. Realization of a unitary using this decomposition can result in a simpler, lower cost circuit.

For $\phi=e^{i\theta}$, $\theta \in \mathbb{R}$, the operator $V(\phi,l)$ can be realized, up to a global phase, using: 1) one ancillary qubit initialized to $|0\rangle$; 2) a single axial rotation $P(\theta)$ of the ancillary qubit; and 3) two identical logical gates (but applied symmetrically about the axial rotation operator) that entangle a primary n-qubit register with the ancilla. For convenience, the entangling logical gates are referred to as cascaded entanglers herein.

With reference to FIG. 1, a quantum circuit 100 implementing $V(\phi,l)$ for $l=1$ includes an n-qubit register 102 (illustrated with n=5), an ancillary qubit 104, entanglement gates 106, 108, and an axial rotation operator 110. The cost of performing such a cascaded entangler in this context depends only on the number of qubits n and on the structure of the operator $V(\phi,l)$ but not on the desired precision of its decomposition.

A representative method 200 is shown in FIG. 2A. At 202, a definition of a diagonal unitary is received. At 204, the diagonal unitary is factored into a product of diagonal operator terms $V(\phi,l)$, each of which is associated with a single rotation and entanglement gates at 206. At 208, the entanglement gates are represented with one or more single or multicontrolled NOT gates, and at 210, these gates are decomposed into Clifford+T circuits. A circuit definition for the input diagonal unitary in the Clifford+T basis is provided at 212. Typically, at least some gates associated with entanglement can be removed as products of the gates return the identity operation. This method is described in detail below.

Figure 3:
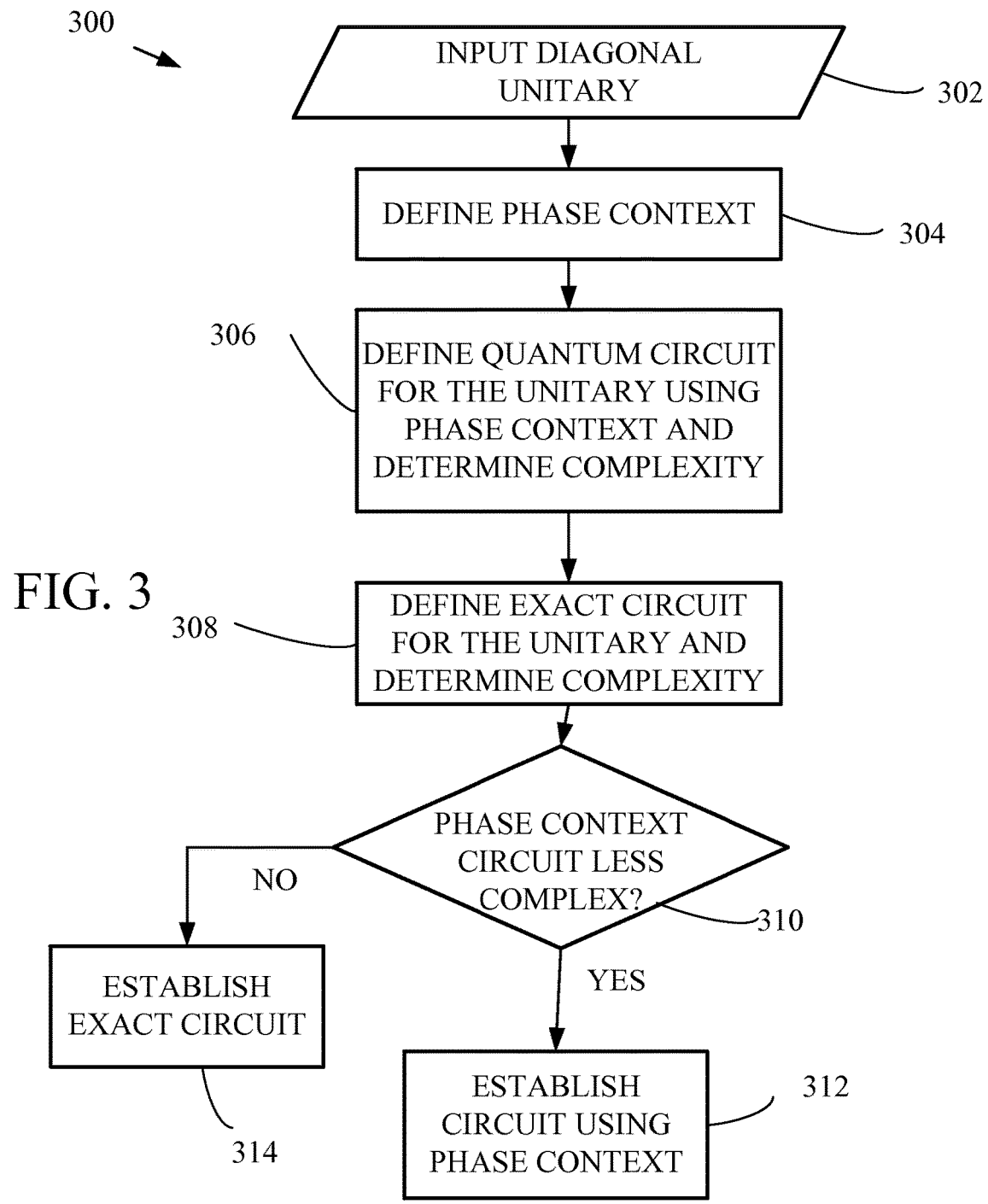
FIG. 3 illustrates a representative method of defining a quantum circuit for a diagonal unitary using an exact (phase dense) representation or a phase context (phase sparse) based representation.

While phase-context based decompositions can be superior, in some cases both phase-context and exact circuits can be determined. As shown in FIG. 3, a representative method 300 includes receiving a definition of a diagonal unitary is received at 302. At 304, a phase context is obtained, and at 306, the diagonal unitary is represented using the phase context and the complexity of the representation is determined. At 308, an exact circuit is defined, and the complexity of the exact circuit determined. At 310, the complexities of the exact and phase-context circuits are compared. Depending on the comparison, the exact circuit is selected at 314 or the phase-context based circuit is selected as 312. In some examples, if a diagonal unitary is determined to be phase sparse, only a phase-context based circuit definition or circuit specification is produced.

The methods of FIGS. 2-3 are described in more detail as follows. Let $J=\{|j_1\rangle, \ldots, |j_l\rangle\}$ be a list of basis vectors rotated by $V(\phi,l)$, i.e., $V|j\rangle = \phi|j\rangle$ when $|j\rangle \in J$ and $V|j\rangle = |j\rangle$ otherwise. Let $\Omega_J(j)$ be a logical activation function where $\Omega_J(j)=1$ when $|j\rangle \in J$ and 0 otherwise. $V(\phi,l)$ can then be expressed more compactly as $$V(\phi,l) = \Sigma_{(j) \in J} \phi \Omega_J(j) |j\rangle\langle j|$$

Associated to each such operator V is a cascaded entangler X(V), which can be formally defined on the n+1 qubit basis as: $X(V)|j\rangle|b\rangle = |j\rangle|b \oplus \Omega(j)\rangle$, wherein $j \in [0, \ldots, 2^n-1]$, $b \in [0,1]$. Such an entangler can be represented exactly by a Clifford+T circuit with a T-count depending only on n and l. Moreover the cost of representing a pair of matching entanglers separated by the ancilla rotation (such as shown in FIG. 1) will be less than twice the cost of one entangler in most cases.

It can be shown that: 1) a cascaded entangler can be represented exactly as a composition of simple and multi-controlled NOT gates (in some cases, with a binary bit string specifying the controls), 2) an optimal composition of this kind depends only on the bit-representation of l; and 3) any multi-controlled NOT gate on n qubits is represented exactly as a Clifford+T circuit with a T-count proportional to the number of control levels (using at most one additional ancillary qubit).

The minimal overall T-count of the Clifford+T circuits required for the implementation of the pair of matching cascaded entanglers can be denoted E[n,l]. The single uncontrolled axial rotation of the ancilla can be approximated to precision $\epsilon$ by a Clifford+T circuit of (expected) T-count $C_0 \log_2(1/\epsilon) + O(\log(\log(1/\epsilon)))$, wherein $C_0$ is a constant depending on the decomposition scheme. Thus the T-count required for approximation of the operator $V(\phi,l)$ is bounded by $$C_0 \log_2(1/\epsilon) + O(\log(\log(1/\epsilon))) + E[n,l].$$

The original target diagonal operator U is represented as a product $$\prod_{m=1}^{k-1} V(\phi_m, \ell_m)$$

and thus can be approximated to precision $\epsilon$ by concatenation of circuits approximating the respective operators $V(\phi_m, l_m)$ to precision $\epsilon/(k-1)$. Therefore the required T-count of the overall approximation circuit is bounded by $$(k-1)C_0 \log_2(1/\epsilon) + O(\log(\log(1/\epsilon))) + E[n,k,\{l_1, \ldots, l_{k-1}\}],$$

wherein $E[n,k,\{l_1, \ldots, l_{k-1}\}]$ is a summary upper bound for the cost of all cascaded entanglers generated in this decomposition.

EXAMPLE

Let $W \in U(2)$ be an arbitrary single-qubit unitary that is to be implemented as an n-qubit controlled version, i.e., as $V=\Lambda^n(W)$, wherein the control is a given binary bit string setting of the n qubits. While V can be decomposed into a network of cascaded CNOT gates and uncontrolled single-qubit unitaries, the cost of such a decomposition can be dominated by the cost of approximating the single-qubit unitaries. If a high precision is required, a more cost-efficient option is to consider an Euler angle decomposition of W first. Let $W=\delta\Lambda(\alpha)H\Lambda(\beta)H\Lambda(\gamma)$, where $\alpha$, $\beta$, $\gamma$, $\delta$ are phase factors and H is the Hadamard gate. Then $\Lambda^n(W)=\Lambda^n(\delta)\Lambda^{n+1}(\alpha)\Lambda^n(H)\Lambda^{n+1}(\beta)\Lambda^n(H)\Lambda^{n+1}(\gamma)$. $\Lambda^n(H)$ is representable exactly in the Clifford+T basis at T-count of O(n) which is independent of the desired approximation precision. But the $\Lambda^n(\delta)$, $\Lambda^{n+1}(\alpha)$, $\Lambda^{n+1}(\beta)$, $\Lambda^{n+1}(\gamma)$ are one-parameter diagonal unitaries. By allowing one ancillary qubit and using cascaded entanglers, each of these can be approximated with a circuit, whose cost, up to the cost of cascaded entanglers is dominated by the T-count of approximating a single single-qubit axial rotation. One implementation of this network uses ancilla qubits and expresses $\Lambda^n(W)$ as a composition of two entanglers and $\Lambda^1(W)$.

The baseline for approximation of a diagonal operator is given by combination of 1) an exact Walsh-based decomposition such as disclosed in Welch et al., "Efficient quantum circuits for diagonal unitaries without ancillas," New Journal of Physics 16:033040 (2014), which is incorporated herein by reference, and 2) independent $\epsilon$—approximation of all the single-qubit rotations generated at step 1). The baseline method allows an external algorithm $A_{single}$ for single-qubit approximate decomposition as a hyperparameter. The external algorithm can be based on any of a variety of approaches such as so-called repeat-until-success circuits, with or without fallback. For a phase-sparse case an alternative approach referred to as Decomposition with Cascaded Entanglers can be used, that also takes the $A_{single}$ as a hyperparameter. A representative procedure is illustrated in Table 1.

TABLE 1

Decomposition with Cascaded Entanglers

Require: n, operator $\text{diag}(\phi_1, \ldots, \phi_{2^n})$, $\epsilon > 0$ {Hyperparameter $A_{single}$}
1:    factors ← $\phi \Pi_{k=1}^m V(\phi_k, 1_k)$ {Phase context factorization}
2:    ret ← {$\phi$}
3:    for k=1..m do
4:        V ← $V(\phi_k, 1_k)$; R ← $P(\phi_k)$
5:        X(V) ← cascaded_entangler(V)
6:        $c_V$ ← CPT(X(V), $I_n \otimes R$, X(V)) {Exact Clifford+T representation}
7:        $c_R$ ← $A_{single}$(R, $\epsilon$) {Approximation circuit}
8:        $c_V$ ← replace(R ↦ $c_R$ in $c_V$)
9:        ret ← $c_V$ + ret
10:   end for
11:   return ret The procedure of Table 1 uses an additional procedure CPT (Clifford+T Cascaded Entangler Decomposition) for exact representation of a pair of matching entanglers (i.e., cascaded entanglers) over the Clifford+T basis. Given a logical gate of the form X(V), a balanced factorization of the gate into multi-controlled NOT gates and known Clifford+T networks is applied. As shown in Table 1, an exact representation of each $\Lambda^m(NOT)$ at T-count in O(m) is used. Such a representation is described in Giles and Selinger, "Exact synthesis of multi-qubit Clifford+T circuits," Phys. Rev. A 87:032332 (2013), which is incorporated herein by reference. The CPT procedure is illustrated in Table 2.

TABLE 2

Clifford+T Cascaded Entangler Decomposition (CPT Method)

Require: n, l
1:    if l = 0 then
2:        return {$I_{n+1}$, 0}
3:    end if
4:    m ← $\lfloor \log_2(l) \rfloor$
5:    if l = $2^m$ then
6:        return { Library circuit for $\Lambda^{n-m}(X) \otimes I_m$, library T-count estimate }
7:    end if
8:    if l < 4/3 $2^m$ then
9:        {$c_1, t_1$} ← CPT(n, l − $2^m$)
10:       {$c_2, t_2$} ← CPT(n, $2^m$)
11:       return {$c_1 c_2, t_1 + t_2$}
12:   end if{Otherwise l > 4/3 $2^m$}
13:   {$c_1, t_1$} ← CPT(n, $2^{m+1}$ − l)
14:   {$c_2, t_2$} ← CPT(n, $2^{m+1}$)
15:   return {$c_1 c_2, t_1 + t_2$}

Figure 2B:
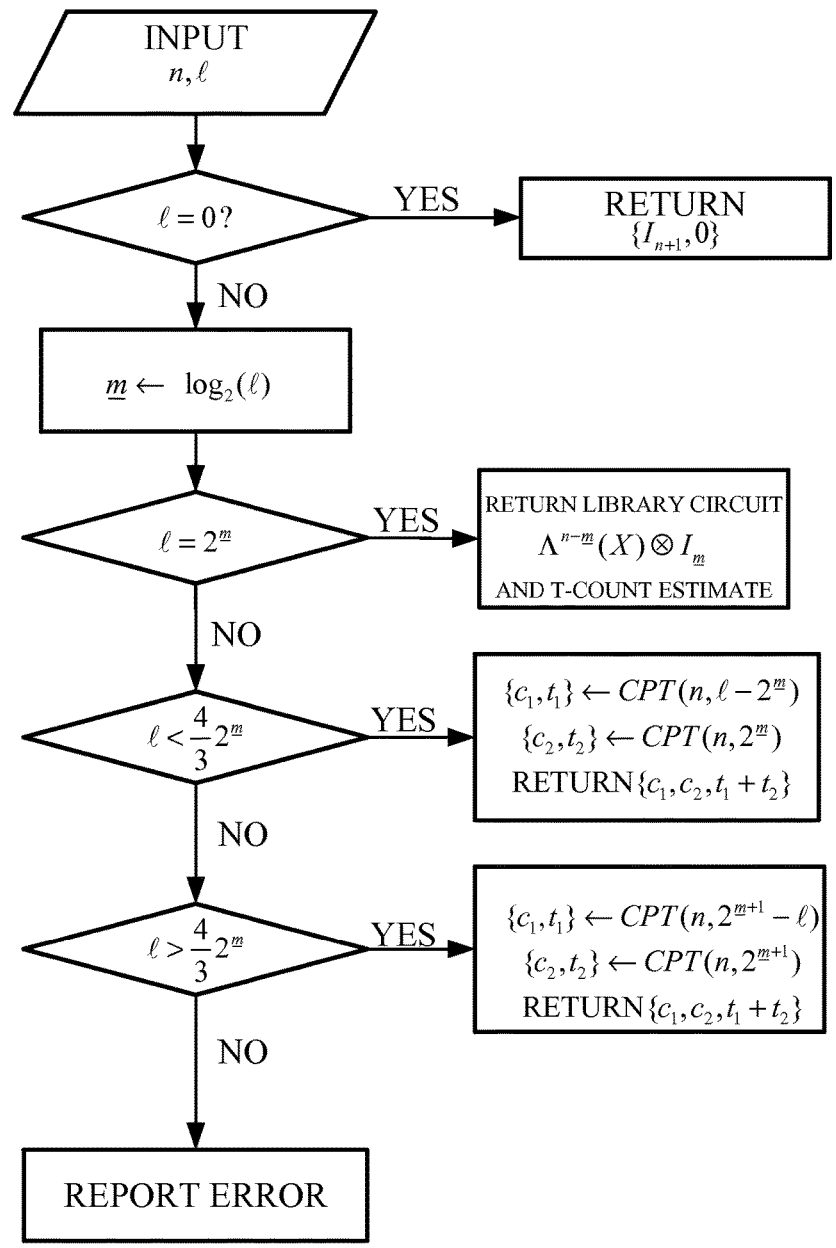
FIG. 2B illustrates a representative method of defining entanglement circuits in a Clifford+T basis based on a number of qubits and a number of occurrences of a selected phase in the diagonal unitary.

The CPT procedure is also illustrated in FIG. 2B. As shown, for V=V($\phi$,l) the cascaded entangler X(V) is completely defined by n and l, and a method for expanding X(V) into a network of multi-controlled CNOT-gates based on a binary representation of l is provided. This network can be used for estimating an upper bound of the cost of X(V) over the Clifford+T basis.

In order to implement V($\phi$,l) as $X_n(l)(I_n \otimes P(\phi))X_n(l)$ the (n+1)-qubit operator $X_n(l)$ is defined as follows:

$X_n(l)|k\rangle|b\rangle = |k\rangle|b\rangle, k<2^n-l, b \in \{0,1\}$ $X_n(l)|k\rangle|b\rangle = |k\rangle|b\oplus 1\rangle, k \geq 2^n-l, b \in \{0,1\}$ When $X_n(l)$ is so defined, then the state $|k\rangle|0\rangle$ picks up the phase factor $\phi$ if and only if $k \geq 2^n-l$, which is exactly how $V(\phi,l) \otimes I$ acts on the $|k\rangle|0\rangle$. A suboptimal way of implementing $X_n(l)$ would be to factor it into $$\prod_{j=2^n-l}^{2^n-1} Y_n(j)$$

where $Y_n(j)|k\rangle|b\rangle = |k\rangle|b \oplus \delta_{kj}\rangle$, k=0, ... $2^n-1$, b∈{0,1} is a variably controlled CNOT-gate which is equivalent to $\Lambda^n(X)$ up to possible bit flip gates on some of the qubits. Under this factorization the cost $X_n(l)$ is dominated by l times the cost of $\Lambda^n(X)$ which is a uniform worst case bound. This bound can generally be improved.

Representative CPT Procedure

A simple recursive algorithm for decomposing the $X_n(l)$ operator is illustrated below. In the cost analysis of the circuits produced by this algorithm the cost of the Pauli and Clifford gates is disregarded, and only the T-count is considered. Consider a slightly more general operator $X_n(p,q)$, $p \leq q \leq 2^n$ defined as $X_n(p,q)|k\rangle|b\rangle = |k\rangle|b \oplus 1\rangle, p \leq k < q$ and $X_n(p,q)|k\rangle|b\rangle = |k\rangle|b\rangle, k<p \| k \geq q$.

With this definition, $X_n(l) = X_n(2^n-l, 2^n)$.

Any $X_n(p,q)$ operator is effectively equivalent to $X_n(q-p)$ modulo the Pauli group. $X_n(p,q)$ is an entanglement operator, where the CNOT on the ancillary qubit is activated by the primary basis states $|p\rangle, \ldots |q-1\rangle$. Let $|b_{n-1} \ldots b_0\rangle$ be the bit representation of the q−1 An adjoining pair of X gates is coupled to any such qubit wire k for which $b_k=0$. The entanglement operator is obtained, wherein the CNOT on the ancillary qubit is activated by the primary basis states $|2^n-(q-p)\rangle, \ldots |2^n-1\rangle$ which is $X_n(q-p)$, i.e., $X_n(p,q)$ is a Pauli adjoint of $X_n(q-p)$. For $p<q_1<q_2$, $X_n(p,q_1)X_n(q_1,q_2)=X_n(p,q_2)$, and $X_n(p,p)$ is the identity operator for any $p \leq 2^n$.

For p<q, consider m=$\lfloor\log_2(q-p)n'\rfloor$ and $\overline{m}=m+1$. Then there are two ways to recursively split the $X_n(l)$ operator:

$X_n(l) = X_n(2^n-l, 2^n-2^{\underline{m}})X_n(2^{\underline{m}})$, or         1)

$X_n(l) = X_n(2^{\overline{m}})X_n(2^n-2^{\overline{m}}, 2^n-l)$         2)

The first split can be written in the form $X_n(l)=P_1X_n(l-2^{\underline{m}})P_1X_n(2^{\underline{m}})$ and the second in the form $X_n(l)=X_n(2^{\overline{m}})P_2X_n(2^{\overline{m}}-l)P_2$, wherein $P_1, P_2$ are effectively computable Pauli involutions. Given $0 \leq m \leq n$, then $X_n(2^m)=\Lambda^{n-m}(X) \otimes I_m$.

Decomposition of $X_n(l)$ into a Clifford+T circuit with near-optimal T-count is based on the fact that as k is growing, the $\Lambda^k(X)$ can be effectively implemented by a Clifford+T network with T-count in O(k). Should this T-count have been perfectly proportional to k, the method below would achieve literal optimality. However we can only establish that the T-count required for implementing $\Lambda^k(X)$ is less than or equal to some κk, wherein κ is a constant.

Let E(n,k) be the T-count required for implementing the $X_n(k)$ operator over Clifford+T. The decomposition strategy is a kind of recursive dynamic programming over the j $\log_2(l)k$ bits that performs the following two-way choice at each level:

0) If l=0, return identity circuit and cost estimate of 0. Otherwise compute $\underline{m}=\lfloor \log_2(l) \rfloor$, $\overline{m}=\underline{m}+1$.

1) If $\log_2(l)$ is an integer and thus $\log_2(l)=\underline{m}$, let $c_{n-\underline{m}}$ be a known library Clifford+T circuit implementing $\Lambda^{n-\overline{m}}(X)$. Return $c_{n-\underline{m}} \otimes I_{\underline{m}}$ and the known T-count of $c_{n-\underline{m}}$ as the cost estimate.

2) Recursively compute a circuit $\underline{c}$ for $X_n(l-2^{\underline{m}})$ along with its estimated T-count $E(n,l-2^{\underline{m}})$.

3) Recursively compute a circuit $\overline{c}$ for $X_n(2^{\overline{m}}-l)$ along with its estimated T-count $\overline{E}(n,l-2^{\underline{m}})$.

4) If $\underline{E}(n,l-2^{\underline{m}})+\kappa<\overline{E}(n,2^{\overline{m}}-l)$, return a concatenation of circuit $\underline{c}$ with a circuit for $\Lambda^{n-\overline{m}}(X)$ and the overall T-count of this concatenation as cost estimate, otherwise return a concatenation of circuit $\overline{c}$ with a circuit for $\Lambda^{n-\overline{m}}(X)$ and the overall T-count of this concatenation as cost estimate.

The runtime of this algorithm is exponential in the bit size of l and therefore is in O(l).

This could be a problem for larger values of l, therefore a simplified logic that makes the algorithm tail-recursive with runtime complexity in O(log(l)) is provided. The simplified algorithm is described as follows:

0) If l=0, return identity circuit and cost estimate of 0; otherwise compute. $\underline{m}=\lfloor \log_2(l) \rfloor$, $\overline{m}=\underline{m}+1$.

1) If $\log_2(l)$ is an integer and thus $\log_2(l)=\underline{m}$, let $c_{n-\underline{m}}$ be the known library Clifford+T circuit implementing $\Lambda^{n-\overline{m}}(X)$ and return $c_{n-\underline{m}} \otimes I_{\underline{m}}$ and the known T-count of $c_{n-\underline{m}}$ as the cost estimate.

2) Otherwise if $$\ell < \frac{4}{3} 2^{\underline{m}}$$

then recursively compute a circuit $\underline{c}$ for $X_n(l-2^{\underline{m}})$ and its T-count estimate $E(n,l-2^{\underline{m}})$; let $c_{c-\underline{m}}$ be the known library Clifford+T circuit implementing $\Lambda^{n-\overline{m}}(X)$.

Return $(c_{n-\underline{m}} \otimes I_{\underline{m}})\underline{c}$ as the circuit and return $E(n,l-2^{\underline{m}})$ plus the T-count of $c_{n-\underline{m}}$ as $E(n,l)$.

3) Otherwise (implying $$\ell < \frac{4}{3} 2^{\underline{m}}),$$

recursively compute a circuit $\overline{c}$ for $X_n(2^{\overline{m}}-l)$ along with its estimated T-count $E(n,2^{\overline{m}}-l)$. Let $c_{n-\overline{m}}$ be the known library Clifford+T circuit implementing $\Lambda^{n-\overline{m}}(X)$ and return $(c_{n-\overline{m}} \otimes I_{\overline{m}})\overline{c}$ as the circuit and return $E(n,2^{\overline{m}}-l)$ plus the T-count of $c_{n-\overline{m}}$ as $E(n,l)$. It is apparent that the argument of the tail recursion in 2) and 3) is designed to always be less than l/2 and therefore the depth of the tail recursion never exceeds $\log_2(l)$.

EXAMPLE

As an example, consider application of the method of Table 2 to l=23. At step 4, a value of $\underline{m}$ is obtained, i.e., $\underline{m}$=4. Since l is greater than $4(2^{\underline{m}})/3$, at steps 13, 14 the procedure CPT is recursively applied. At step 14, a library circuit is obtained from the subsequent CPT procedure while at step 13, the CPT procedure is called using $2^{\underline{m}+1}-l=9$ instead of l. With l=9, steps 9, 10 are executed, resulting in a library circuit from the CPT call in step 10, and an additional CPT procedure call with l=9−8=1 from step 10. As a result, circuits for $\underline{m}$=1, 8, 32 are obtained, corresponding to 23=32−8−1. An alternative circuit can be construed using a decomposition based on 23=16+4+2+1, but this circuit requires a series of 4 entanglement sequences.

Figure 4:
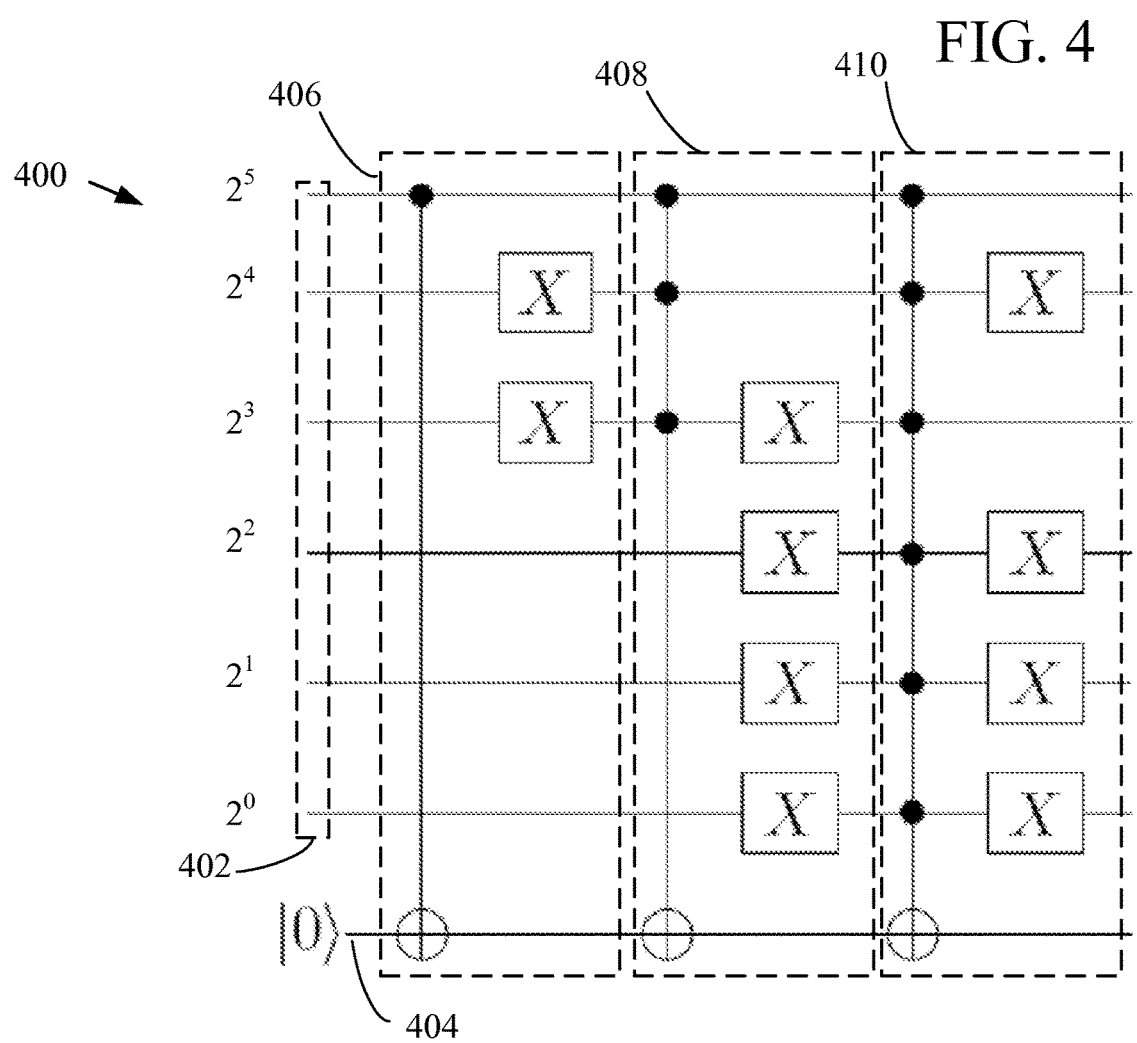
FIG. 4 illustrates a quantum circuit implementing a cascaded entangler.
Figure 5:
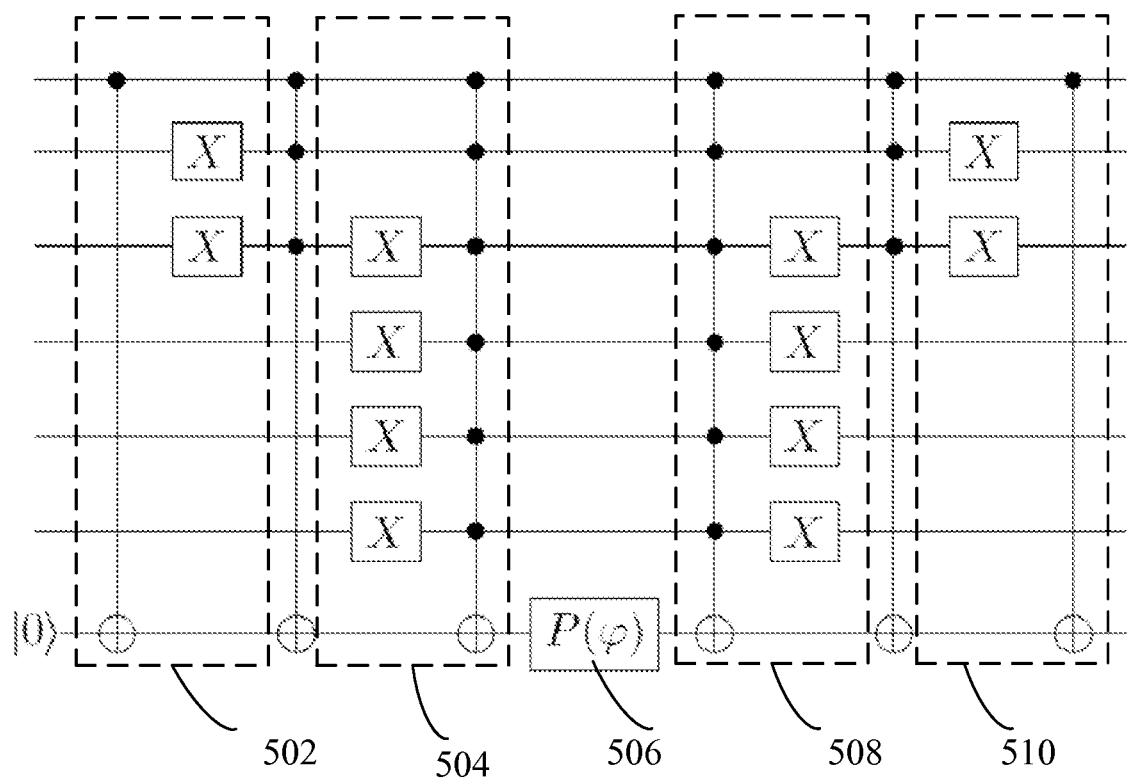
FIG. 5 illustrates a representative quantum circuit associated with a single phase in a phase context.

FIG. 4 illustrates a corresponding entangling circuit 400 (associated with $X_6(23)$) shown with a 5-bit register 402 and a single ancillary qubit 404. A first entangling circuit 406 (corresponding to $2\underline{m}+1=5$) is coupled to a qubit associated with a bit value of $2^5=32$ and the ancillary qubit 404. Similar bit values greater than or equal to 8 are coupled to the ancillary qubit 404 by a second entangling circuit 408 (corresponding to $2\underline{m}+1=3$). A third entangling circuit 410 is associated with $2\underline{m}+1=1$. The full expansion is $X_6(23)=X_6(32)+P_1X_6(8)+P_1P_2+X_6(1)+P_2$, wherein $P_1$, $P_2$ are Pauli gates. FIG. 5 illustrates a circuit 500 implementing $V_6(\varphi, 23)$. The circuit includes entangling circuits 502, 504, 508, 510 that can include one or more X-gates, and a rotation gate 506. As shown, the circuit pairs 502, 504 and 506, 508 are symmetrically situated with respect to the rotation gate 506.

Computing Environments

Figure 6:
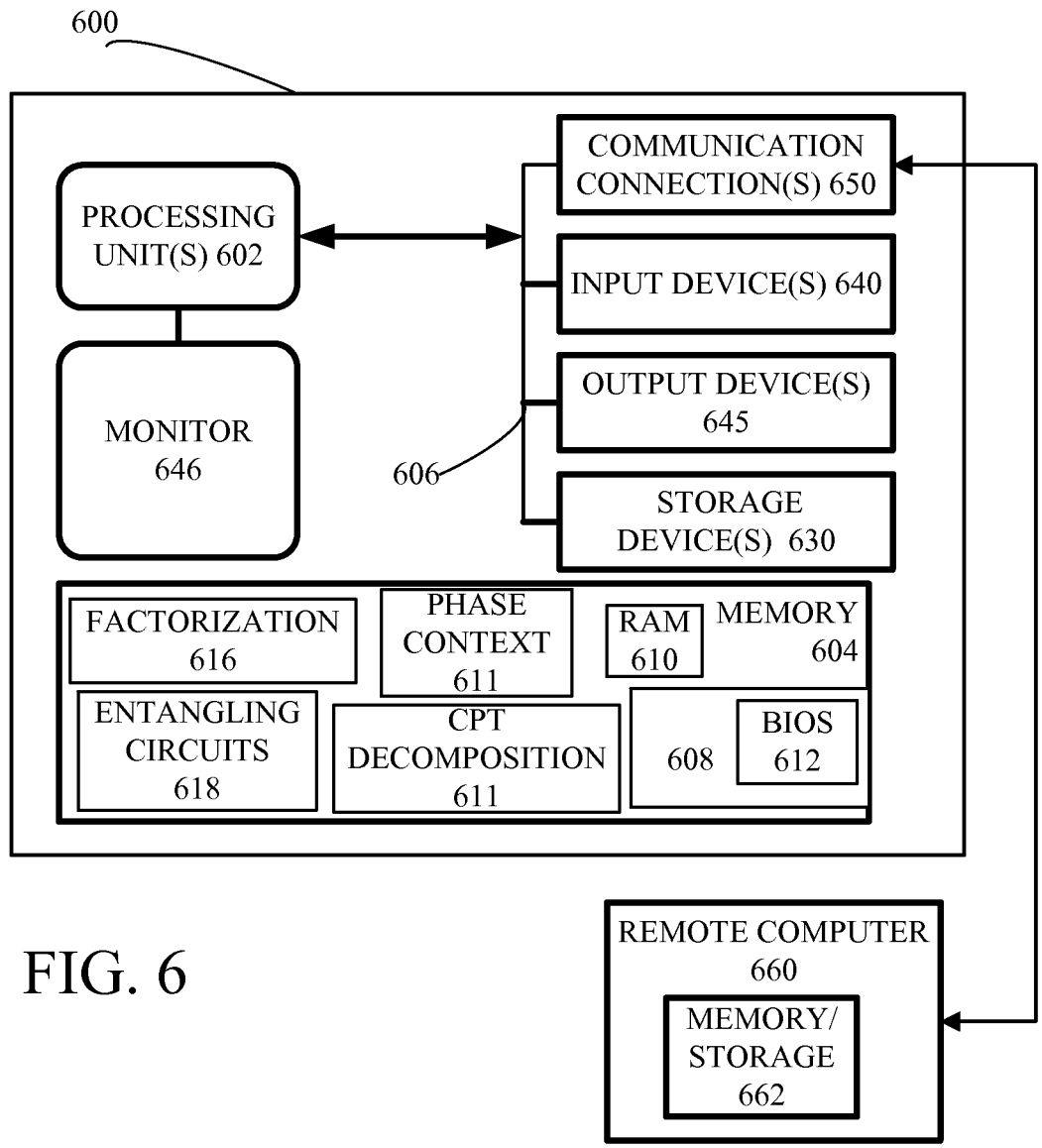
FIG. 6 illustrates a representative processor-based quantum circuit design environment.

FIG. 6 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 6, an exemplary system for implementing the disclosed technology includes a general purpose computing device in the form of an exemplary conventional PC 600, including one or more processing units 602, a system memory 604, and a system bus 606 that couples various system components including the system memory 604 to the one or more processing units 602. The system bus 606 may be any of several types of bus structures including a memory bus or memory controller, a peripheral bus, and a local bus using any of a variety of bus architectures. The exemplary system memory 604 includes read only memory (ROM) 608 and random access memory (RAM) 610. A basic input/output system (BIOS) 612, containing the basic routines that help with the transfer of information between elements within the PC 600, is stored in ROM 608.

As shown in FIG. 6, computer-executable instructions for diagonal unitary factorization are stored in a memory portion 616 and values associated with a phase context are stored at 617. In addition, a memory portion 618 stores entangling circuit definitions obtained that can be decomposed into the Clifford+T basis using computer-executable instructions stored in a memory portion 611. Computer-executable instructions are also stored for receiving rotation angles and precisions as well as communicating circuit definitions.

The exemplary PC 600 further includes one or more storage devices 630 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 606 by a hard disk drive interface, a magnetic disk drive interface, and an optical drive interface, respectively. The drives and their associated computer readable media provide nonvolatile storage of computer-readable instructions, data structures, program modules, and other data for the PC 600. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 630 including an operating system, one or more application programs, other program modules, and program data. Storage of quantum syntheses and instructions for obtaining such syntheses can be stored in the storage devices 630 as well as or in addition to the memory 604. A user may enter commands and information into the PC 600 through one or more input devices 640 such as a keyboard and a pointing device such as a mouse. Other input devices may include a digital camera, microphone, joystick, game pad, satellite dish, scanner, or the like. These and other input devices are often connected to the one or more processing units 602 through a serial port interface that is coupled to the system bus 606, but may be connected by other interfaces such as a parallel port, game port, or universal serial bus (USB). A monitor 646 or other type of display device is also connected to the system bus 606 via an interface, such as a video adapter. Other peripheral output devices, such as speakers and printers (not shown), may be included. In some cases, a user interface is display so that a user can input a circuit for synthesis, and verify successful synthesis.

The PC 600 may operate in a networked environment using logical connections to one or more remote computers, such as a remote computer 660. In some examples, one or more network or communication connections 650 are included. The remote computer 660 may be another PC, a server, a router, a network PC, or a peer device or other common network node, and typically includes many or all of the elements described above relative to the PC 600, although only a memory storage device 662 has been illustrated in FIG. 6. The personal computer 600 and/or the remote computer 660 can be connected to a logical a local area network (LAN) and a wide area network (WAN). Such networking environments are commonplace in offices, enterprise wide computer networks, intranets, and the Internet.

When used in a LAN networking environment, the PC 600 is connected to the LAN through a network interface. When used in a WAN networking environment, the PC 600 typically includes a modem or other means for establishing communications over the WAN, such as the Internet. In a networked environment, program modules depicted relative to the personal computer 600, or portions thereof, may be stored in the remote memory storage device or other locations on the LAN or WAN. The network connections shown are exemplary, and other means of establishing a communications link between the computers may be used.

Figure 7:
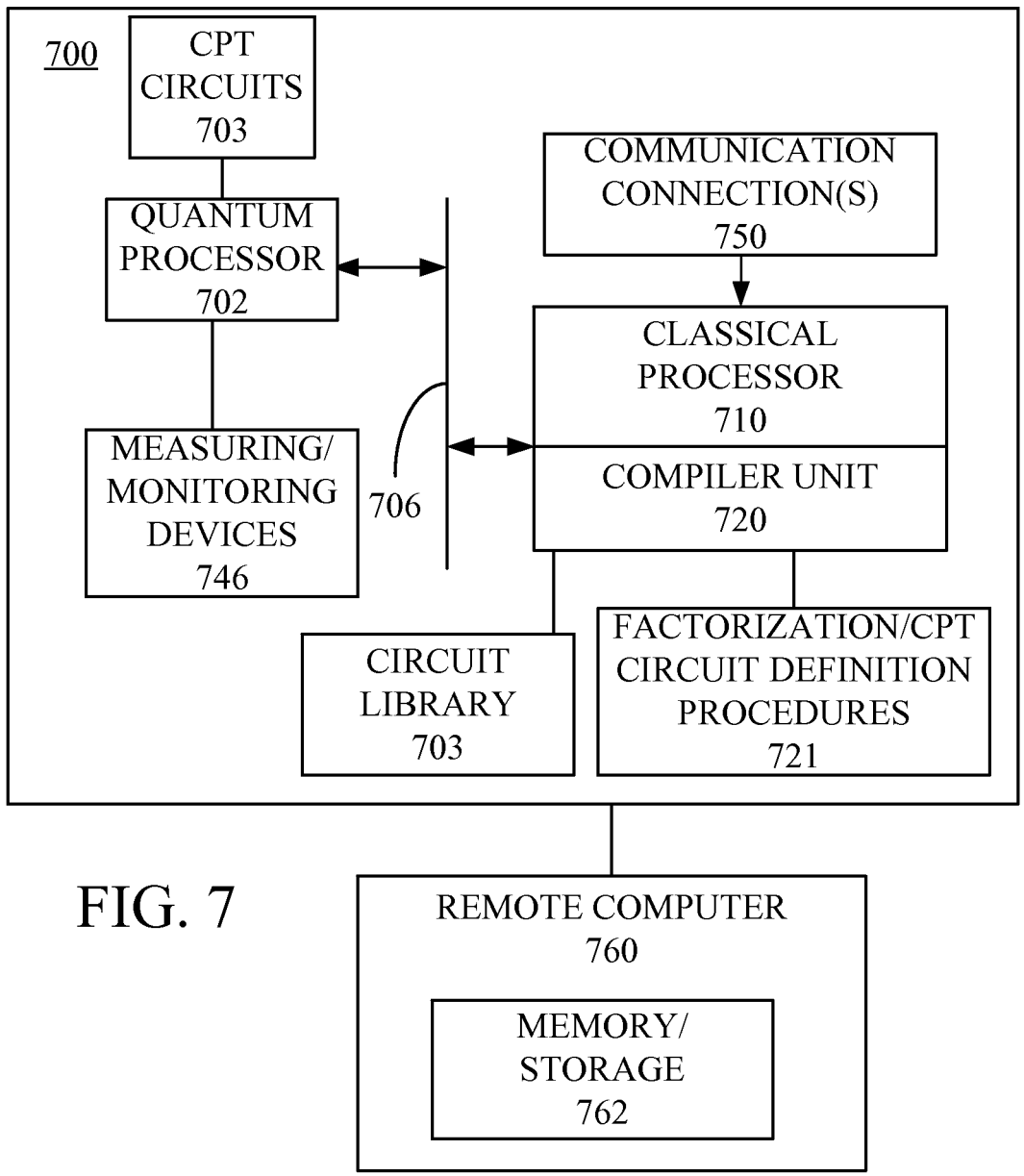
FIG. 7 illustrates a representative classical computer that produces a quantum circuit arrangement that is coupled to a quantum processor.

With reference to FIG. 7, an exemplary system for implementing the disclosed technology includes computing environment 700, where compilation into braid pattern circuits is separated from the quantum processing that consumes the compiled circuits. The environment includes a quantum processing unit 702 and one or more monitoring/measuring device(s) 746. The quantum processor executes quantum circuits that are precompiled by classical compiler unit 720 utilizing one or more classical processor(s) 710. The precompiled quantum circuits such as RUS circuits 703 are downloaded into the quantum processing unit via quantum bus 706.

With reference to FIG. 7, the compilation is the process of translation of a high-level description of a quantum algorithm into a sequence of quantum circuits. Such high-level description may be stored, as the case may be, on one or more external computer(s) 760 outside the computing environment 700 utilizing one or more memory and/or storage device(s) 762, then downloaded as necessary into the computing environment 700 via one or more communication connection(s) 750. Alternatively, the classical compiler unit 720 is coupled to a classical processor 710 and a procedure library 721 that contains some or all procedures necessary to implement the methods described above such as factorization, defining phase contexts, decomposition of entanglement circuits into Clifford+T circuits as well as a circuit library 703 that stores compiled circuits or circuit definitions to be used.

Having described and illustrated the principles of our invention with reference to the illustrated embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples. Alternatives specifically addressed in these sections are merely exemplary and do not constitute all possible

The invention claimed is:

1. A method of defining a quantum circuit for implementing a diagonal unitary in a quantum computer, comprising:
   receiving a definition of the diagonal unitary with respect to a set of n qubits, wherein n is a positive integer;
   receiving an approximation precision;
   based on a phase context, processing the diagonal unitary so as to select a plurality of single-qubit rotation operators having rotation angles in the phase context;
   defining the quantum circuit based on the plurality of rotation operators applied to an ancillary qubit; and
   implementing the quantum circuit based on the definition.

2. The method of claim 1, wherein the phase context is sparse.

3. The method of claim 1, further comprising assessing a cost associated with the quantum circuit as defined based on the phase context.

4. The method of claim 3, wherein the quantum circuit defined based on the phase context includes a plurality of cascaded entanglement gate sequence pairs, and the cost of the quantum circuit is estimated based on the plurality of cascaded entanglement gate sequence pairs.

5. The method of claim 4, further comprising assessing an cost associated with an exact representation of the diagonal unitary; and
   if the cost of the phase dense representation is less than that of the phase sparse complexity assessment, defining the quantum circuit based on the exact representation.

6. The method of claim 3, wherein the cost is associated with a number of single qubit rotations or a number of T-gates in the quantum circuit.

7. The method of claim 1, wherein the quantum circuit is defined in a Clifford+T basis.

8. The method of claim 7, further comprising factoring the diagonal unitary into a product of the form $$\prod_{m=1}^{k-1} V(\phi_m, l_m),$$

wherein $V(\phi, 1_m) = \text{diag}(1, \ldots, 1, \phi, \ldots, \phi_m)$, m is a positive integer, $\phi_m$ is a phase in the phase context, and $1_m$ is a number of occurrences of the phase $\phi_m$ in $V(\phi_m, 1_m)$.

9. The method of claim 8, further comprising defining cascaded entanglement gate sequence pairs associated with one or more of the $V(\phi_m, 1_m)$ based on the number of qubits n and 1.

10. The method of claim 9, wherein the cascaded entanglement gate sequence pairs are determined based on evaluation of $|\log_2(1_m)|n$ for at least one value of m.

11. A system for designing a quantum computer, comprising:
a communication connection that receives a definition of a diagonal unitary over n qubits; and
a processor that:
factors the diagonal unitary so that the diagonal unitary is representable as a product of the factors of the form $V(\phi_m, 1_m) = \text{diag}(1, \ldots, 1, \phi_m, \ldots, \phi_m)$, wherein m is a positive integer, $\phi_m$ is a phase in a phase context, and $1_m$ is a number of occurrences of the phase $\phi_m$ in $V(\phi_m, 1_m)$; and
produces a quantum circuit design corresponding to the diagonal unitary based on the factors $V(\phi_m, 1_m)$.

12. The system of claim 11, wherein the processor further establishes a single single-qubit rotation gate and at least one cascaded entanglement circuit with each of the factors $V(\phi_m, 1_m)$, and the quantum circuit design is based on gate sequences associated with the single-qubit rotation gates and the cascaded entanglement circuits.

13. The system of claim 12, wherein processor defines gates for a cascaded entanglement circuit associated with at least one of the factors $V(\phi_m, 1_m)$ based on $1_m$ and a number of qubits n.

14. The system of claim 11, wherein processor defines gates for the at least one cascaded entanglement circuit associated with each of the factors $V(\phi_m, 1_m)$ based on $1_m$ and a number of qubits n.

15. The system of claim 14, wherein the at least one cascaded entanglement circuit is determined based on evaluation of $|\log_2(1_m)|n$.

16. The system of claim 11, wherein the processor further establishes the phase context as a set of random phases.

17. The system of claim 11, wherein the phase context is sparse.

18. The system of claim 17, wherein a ratio of a number of distinct phases in the diagonal unitary to $2^n$ is less than or equal to ½.

19. The system of claim 11, wherein the processor produces the quantum circuit design based on quantum gates of the Clifford+T basis.

20. A computer-assisted quantum circuit design method, comprising:
classifying a diagonal unitary as phase sparse or phase dense;
producing a quantum circuit design based on a factorization of the diagonal unitary over a phase context for any diagonal unitary classified as phase sparse; and
implementing the quantum circuit based on the quantum circuit design.

21. The computer-assisted quantum circuit design method of claim 20, wherein the quantum circuit design includes rotation circuits and entanglement circuits, and further comprising defining at least one entangling circuit based on a number of occurrences of a corresponding phase in the diagonal unitary.

* * * * *